United States Patent
Pappu

(10) Patent No.: US 10,204,025 B2
(45) Date of Patent: Feb. 12, 2019

(54) MECHANISM TO PROVIDE BACK-TO-BACK TESTING OF MEMORY CONTROLLER OPERATION

(71) Applicant: Intel Corporation, Santa Clara, CA (US)

(72) Inventor: Lakshminarayana Pappu, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 15 days.

(21) Appl. No.: 15/442,039

(22) Filed: Feb. 24, 2017

(65) Prior Publication Data

US 2018/0246796 A1    Aug. 30, 2018

(51) Int. Cl.

| | |
|---|---|
| *G11C 29/00* | (2006.01) |
| *G06F 11/277* | (2006.01) |
| *G06F 13/42* | (2006.01) |
| *G06F 13/38* | (2006.01) |
| *G06F 13/40* | (2006.01) |
| *G11C 29/32* | (2006.01) |
| *G11C 29/38* | (2006.01) |
| *G06F 11/22* | (2006.01) |
| *G11C 29/12* | (2006.01) |

(52) U.S. Cl.
CPC .......... *G06F 11/277* (2013.01); *G06F 11/221* (2013.01); *G06F 13/385* (2013.01); *G06F 13/4022* (2013.01); *G06F 13/4282* (2013.01); *G11C 29/1201* (2013.01); *G11C 29/32* (2013.01); *G11C 29/38* (2013.01); *G06F 11/2221* (2013.01); *G06F 2213/0026* (2013.01)

(58) Field of Classification Search
CPC .. G06F 11/277; G06F 11/221; G06F 11/2221; G06F 13/4282; G06F 13/385; G06F 13/4022; G06F 2213/0026; G11C 29/32; G11C 29/38; G11C 29/1201
See application file for complete search history.

(56) References Cited

U.S. PATENT DOCUMENTS

2012/0046930 A1* 2/2012 Schaub ............... G06F 17/5022
703/13

* cited by examiner

*Primary Examiner* — Samir W Rizk
(74) *Attorney, Agent, or Firm* — Schwabe, Williamson & Wyatt, P.C.

(57) ABSTRACT

Embodiments are generally directed to a mechanism to provide back-to-back testing of memory controller operation. An embodiment of an apparatus includes a test controller including a specialized self-testing mechanism for memory control testing, the memory control testing including testing with back-to-back transactions; and a memory controller, the memory controller including one or more transaction arbiters, one or more arbiter queues for memory transactions, an auto response mechanism to provide a response to a read transaction, and a switching mechanism to switch the memory control between a functional mode and an auto response mode. The test controller is to generate test transactions and transfer the test transactions to the memory controller. The memory controller is to block the one or more transaction arbiters, place the plurality of test transactions in the one or more arbiter queues, and to unblock the transaction arbiters upon an event.

20 Claims, 6 Drawing Sheets

MECHANISM TO PROVIDE BACK-TO-BACK TESTING OF MEMORY CONTROLLER OPERATION

TECHNICAL FIELD

Embodiments described herein generally relate to the field of electronic devices and, more particularly, a mechanism to provide back-to-back testing of memory controller operation.

BACKGROUND

In memory systems, the capability of sending multiple memory transactions and receiving response from the memory controller is a tool utilized in testing of transaction arbiters in memory controllers and serial IO units or devices such as PCIE (Peripheral Component Interconnect Express), SATA (Serial AT Attachment), and USB (Universal Serial Bus).

However, as interfaces in computer systems increase in speed, certain testing of electronics may be adversely affected because of the inability of a tester to submit multiple memory transactions near in time with each other.

In the operation of a memory controller, there are generally delays between operations because of functioning of the auto response mechanism of the memory controller, the auto response mechanism being a hardware mechanism built into the memory controller to respond to the incoming transactions. Because of this, it has become more difficult to fully stress a system during testing because the memory transactions utilized in the test are separated from each other in time.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to test controller back-to-back testing mode for memory controller testing.

For the purposes of this description:

"Test controller" or "TC" refers to a hardware test controller that capable of sending and receiving transactions.

"Back-to-Back Mode" or "B2B Mode" refers to a testing mode by which an element or process programs a number of transactions to be sent in a burst mode, the transactions to run without any external interaction.

In some embodiments, an apparatus, system, or process provides for a back-to-back testing mode for memory controller testing. In some embodiments, a test controller is to provide back-to-back testing for a test controller by transmitting multiple memory transactions and responses from the memory controller, wherein the transmission of memory transactions and responses are made without delays between testing cycles.

In some embodiments, a hardware controller mechanism on a system fabric is operable to support back-to-back transactions in the memory controller. In some embodiments, the hardware controller mechanism includes a mechanism to block operation of transaction arbiters in the memory controller and thus fill up the arbiter queues, which may be used to enable testing in which a burst of data in multiple back-to-back operations is transferred by the memory controller.

In an implementation, data traffic is routed through high speed serial IOs (Input Outputs), and an auto response mechanism is included in the memory controller to eliminate the need for memory DIMM (Dual Inline Memory Module) operation in the testing process. In some embodiments, an apparatus includes a back-to-back testing mode to enable testing of the transaction arbiters in the memory controllers and the serial IO devices, wherein the serial IO devices includes PCIE (Peripheral Component Interconnect, a high speed serial computer expansion bus standard), SATA (Serial Attachment, a computer bus interface that connects host bus adapters to mass storage devices such as hard disk drives, optical drives and solid state drives), and USB (Universal Serial Bus) controllers and all the interconnecting components.

In some embodiments, a testing apparatus includes signature collection, signature collection being a method to compress and capture all the transaction flow to and from the test controller and the memory controller.

Figure 1:
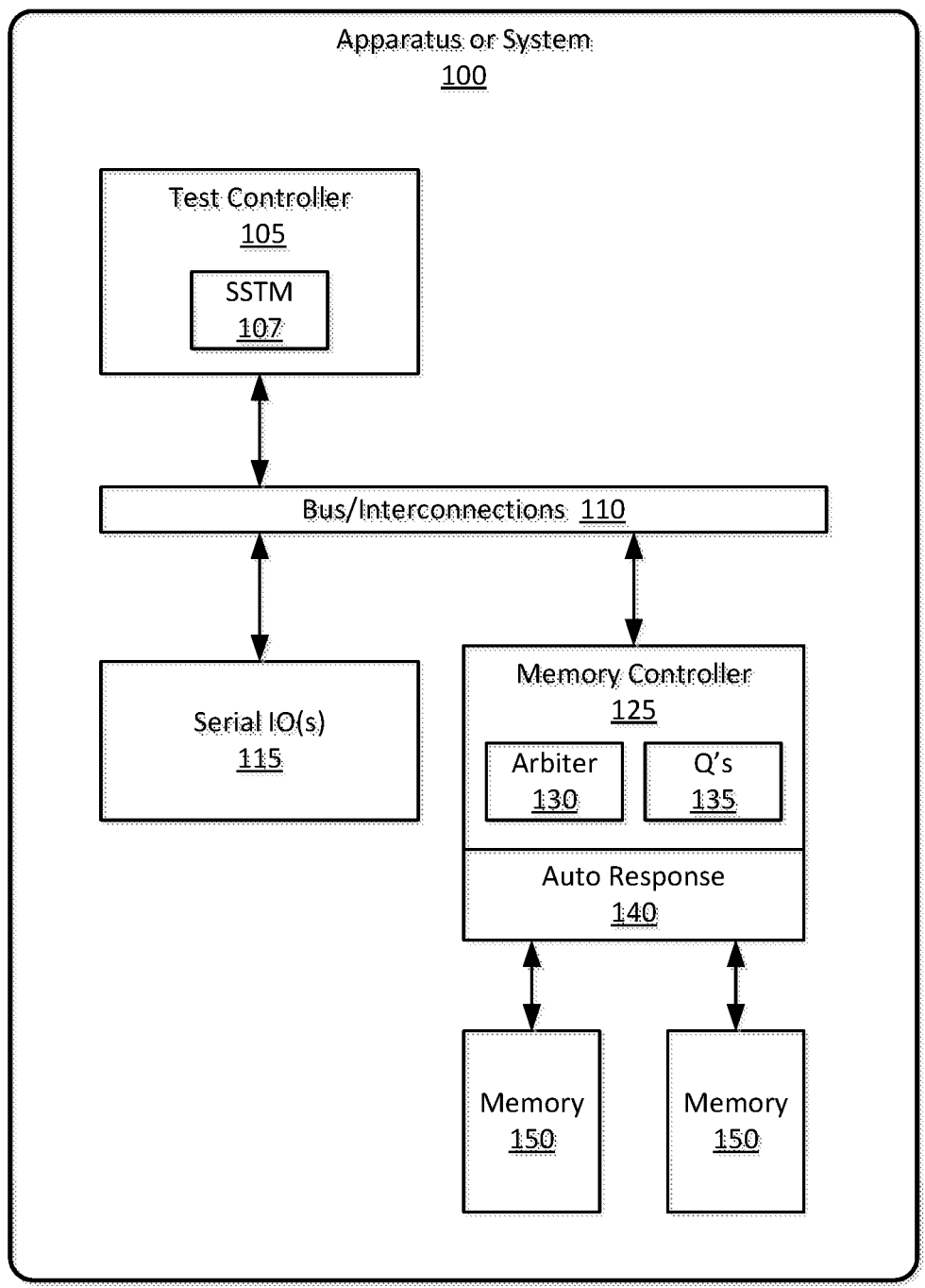
FIG. 1 is an illustration of elements in a test structure to support back-to-back testing in an apparatus or system according to an embodiment.

FIG. 1 is an illustration of elements in a test structure to support back-to-back testing in an apparatus or system according to an embodiment. As illustrated in FIG. 1, a test controller 105 is coupled via a system fabric with serial IO devices 115 and with a memory controller 125, the memory controller 125 to control memory transactions with one or more memory devices 150.

In some embodiments, the controller mechanism on a system fabric is operable to support back-to-back transactions in the memory controller. In some embodiments, the hardware controller mechanism includes a mechanism to block operation of transaction arbiters in the memory controller and thus fill up the arbiter queues, which may be used to enable testing in which a burst of data in multiple back-to-back operations is transferred by the memory controller.

In some embodiments, an apparatus or system 100 includes a test controller 105, the test controller includes a specialized self-testing mechanism (SSTM) 107 to provide for back-to-back testing operations. In some embodiments, the test controller 105 is to communicate with one or more serial IO devices (serial IOs) 115 and a memory controller 125 via a system bus or other interconnections 110, which may include, but is not limited to, a system fabric. In some embodiments, the memory controller 125 includes one or more transaction arbiters including transaction arbiter 130, and one or more transaction queues 135, and further includes an auto response mechanism 140, wherein auto response mechanism is to provide automatic response to a read transaction in a test operation.

In some embodiments, the test controller 105 utilizes the specialized self-testing mechanism 107 to generate test memory transactions, including a back-to-back (B2B) test mode by which the test controller 105 can provide testing of the memory controller 125 that includes multiple memory transactions in a burst, without waiting for response from the auto response flow. In some embodiments, the test controller 105 is to block the transaction arbiter 130 of the memory controller 125, allowing the queues 135 of the memory controller to fill with test memory transactions. In some embodiments, the test controller 105 is further to release the transaction arbiter 130 of the memory controller 125, and the memory controller is then to release a burst of memory transactions.

In some embodiments, the auto response mechanism 140 of the memory controller 125 is to enable responses to read transactions in the back-to-back test mode, the memory controller thus handling test memory transactions without requiring access to the memory devices 150. In some embodiments, the memory controller is further to provide for data collection for write transactions in the test mode.

Figure 2:
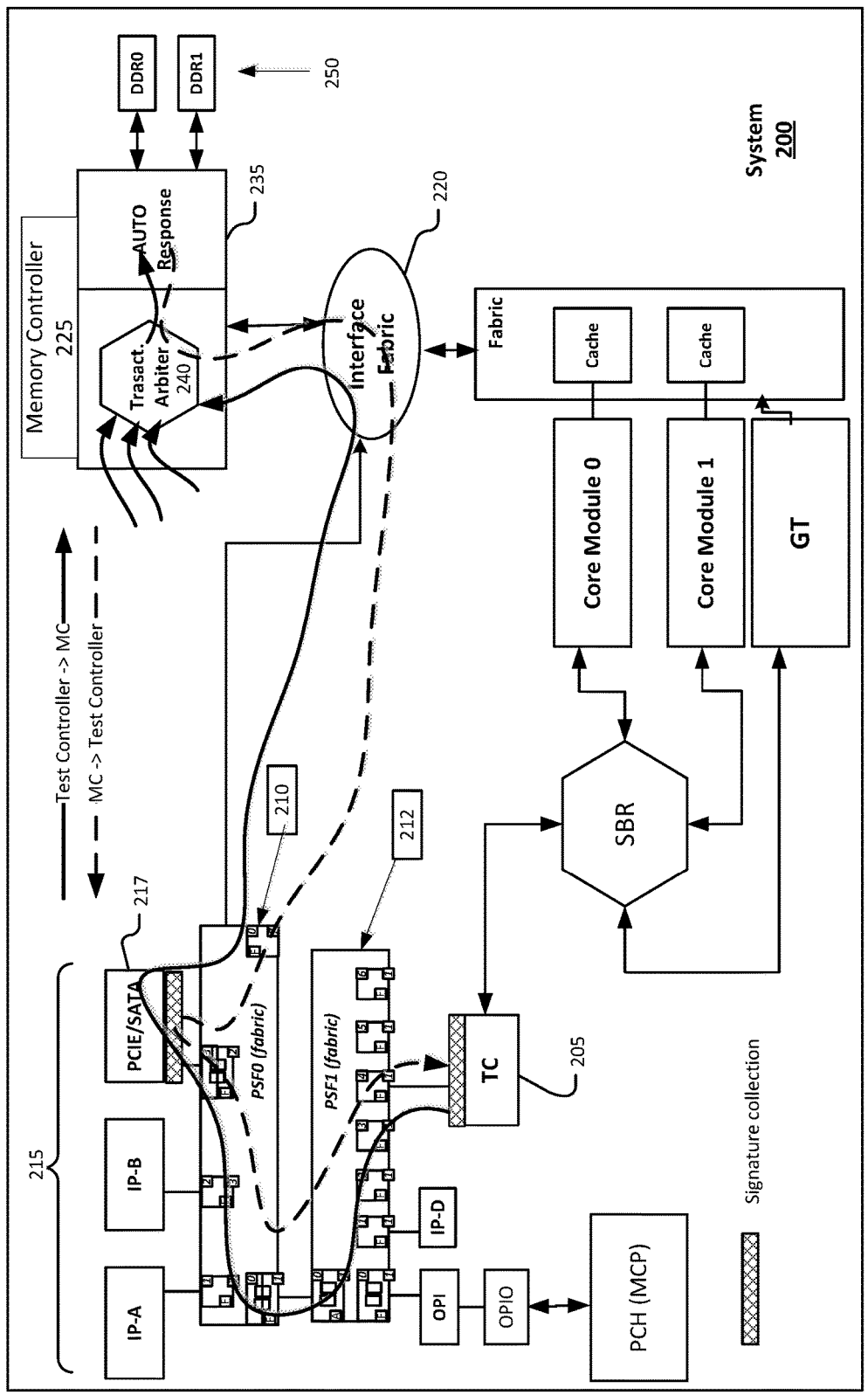
FIG. 2 is an illustration of an apparatus or system including a test controller to send multiple memory transactions and responses via a memory controller according to an embodiment.

FIG. 2 is an illustration of an apparatus or system including a test controller to send multiple memory transactions and responses via a memory controller according to an embodiment. In some embodiments, a system includes a test controller (TC) 205, the test controller 205 including a back-to-back (B2B) test mode by which the test controller 205 can provide testing of a memory controller 225 that includes multiple memory transactions in a burst, without waiting for response from the auto response flow.

As illustrated in FIG. 2, the test controller 205 is coupled with serial IO elements 215, including a PCIE or SATA IO element 217, via a system fabric, the system fabric illustrated as PSF0 210 and PSF1 212 (Primary Scalable Fabric 0 and Primary Scalable Fabric 1) and interface fabric 220. In some embodiments, the serial IO elements 215 coupled via the system fabric to memory controller 225, which is coupled with memory 250, illustrated as DDR0 and DDR1 (DDR referring to Double Data Rate memory). In some embodiments, the memory controller 225 includes one or more transaction arbiters 240 and an auto response mechanism 235 to provide response in a test mode.

In some embodiments, the test mode capability of the test controller 205 and memory controller 225 is applied to test the transaction arbiters 240 in the memory controller 225, the serial IO elements 215 such as PCIE/SATA/USB controllers, and all interconnecting components. In some embodiments, the test controller 205 is to send back-to-back transactions to the memory controller 225 through the PCIE/SATA IO elements 217. In some embodiments, transaction arbiters 240 in the memory controller 225 are blocked, and hence arbiter queues are filled. In some embodiments, after a certain threshold number of multiple transactions are queued at the one or more transaction arbiters 240, the one or more transaction arbiters 240 are unblocked to allow the issuance of back-to-back test transactions. The arbiter algorithms direct the transactions towards the external memory. In some embodiments, the apparatus or system allows for signature collection at one or more of the test controller 205 and the PCIE or SATA elements 217, a process to compress and capture all the transaction flow to and from the test controller to the memory controller.

FIG. 2 includes illustration of other components of the system 200 that are beyond the subject matter of this discussion, including a platform controller hub (PCH) in a multi-chip package (MCP), and SBR (serial boot ROM) coupled with one or more core modules (Core Module 0 and Core Module 1).

Figure 3:
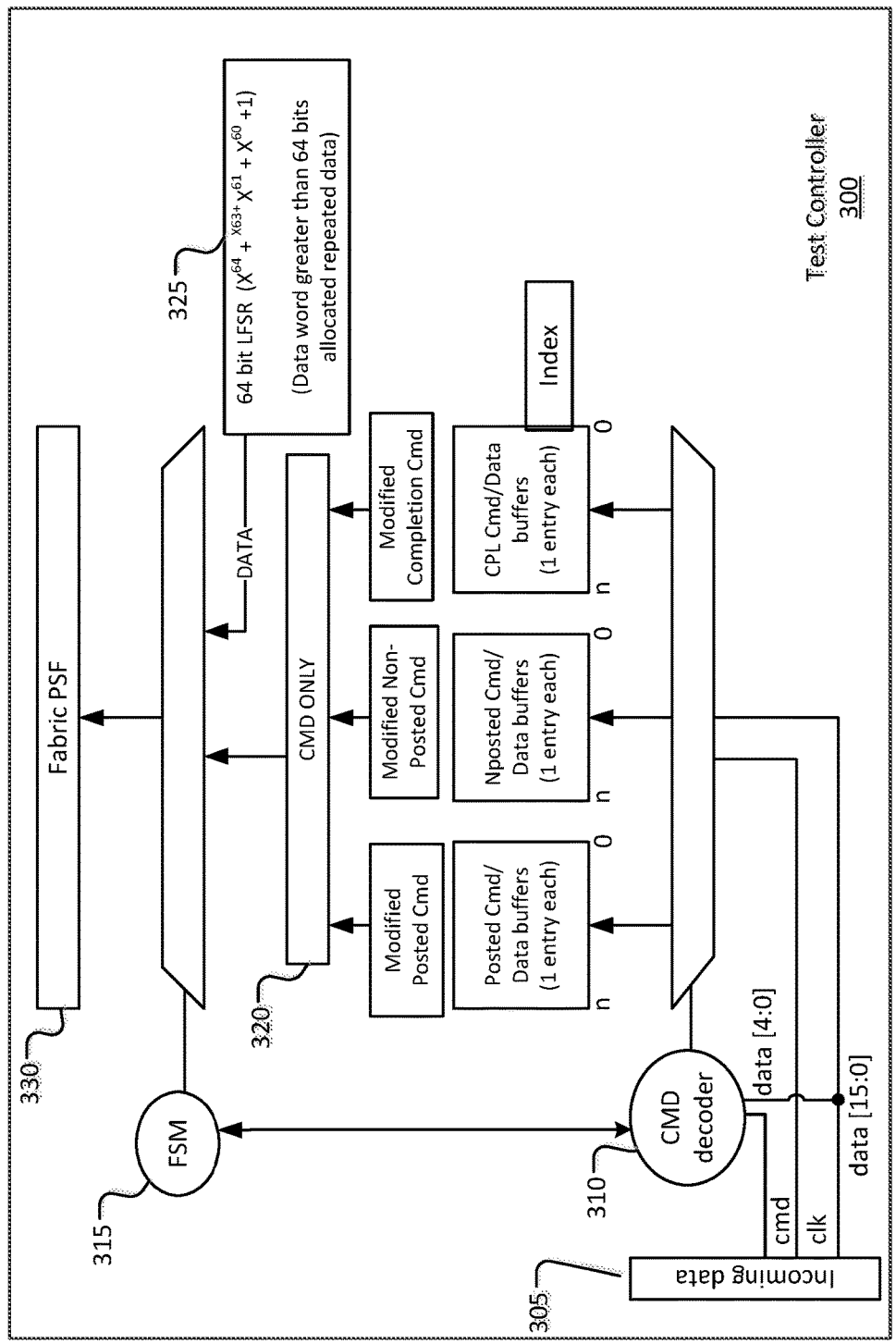
FIG. 3 is an illustration of a test controller to provide back-to-back testing of a memory controller transaction arbiter according to an embodiment.

FIG. 3 is an illustration of a test controller to provide back-to-back testing of a memory controller transaction arbiter according to an embodiment. In a test mode referred to as an SBFT (Structural Based Functional Testing) mode, interaction of the test controller 300 with the tester (the entity directed the testing operation) should be minimal to allow for functional testing of system components. In some embodiments, the test controller 300 is equipped with specialized self-testing mechanisms to allow for testing capabilities in the test mode. In SBFT mode, the test controller 300 is operable to issue a sequence of back-to-back operations, which may include memory writes to a sequence of memory addresses, or memory reads from a sequence of memory addresses. For non-posted transactions, the system may respond with pseudo random or pre-programmed data. The test controller 300 thus provides a user with the flexibility to select an order of addressing and the type of operations to perform in test mode.

In some embodiments, the types of operations the test controller 300 can perform in the SBFT mode are as provided in Table 1, wherein DW=double word; a "posted command" is a command that does not wait for a completion response; a "non-posted command" is a command that waits for a completion response to indicate success or failure of the transaction; and a "completion" is a response to a command.

TABLE 1

| Type of Operation | Test Data |
|---|---|
| Posted | Command + 16DW/64DW data (single entry); 16 DW for most of the SOCs/Clients and 64DW for PCH |
| Non-Posted | Command + 1DW data (single entry) |
| Completion | Command + 16DW/64DW data (single entry) |

As illustrated in FIG. 3, incoming data 305 is received at the test controller 300, wherein a command decoder 310 decodes a command 320 as a modified posted command, non-posted command, or completion command. The command decoder 310 may be coupled with a finite state machine (FSM) 315 or other similar element to control the selection of commands and data for test transactions. For a non-posted command, an operation can either respond with deterministic data stored in the Non-posted command buffer or with pseudo random data. In some embodiments, the test controller includes a LFSR (Linear Feedback Shift Register), such as, for example, the illustrated 64-bit LFSR 325 ($X^{64}+X^{63}+X^{61}+X^{60}+1$), wherein data words greater than 64 bits may be allocated repeated data. In some embodiments, the 64 bit LFSR 325 is to produce pseudo random data on every clock cycle, and this data is combined with the command 320 to be sent onto the fabric 330. In some embodiments, a 64 bit MISR (Multiple Input Signature Register) is enabled with a burst mode enable bit, and cycles through generation of data on every TAM (Test Access Mechanism) cycle.

Figure 4:
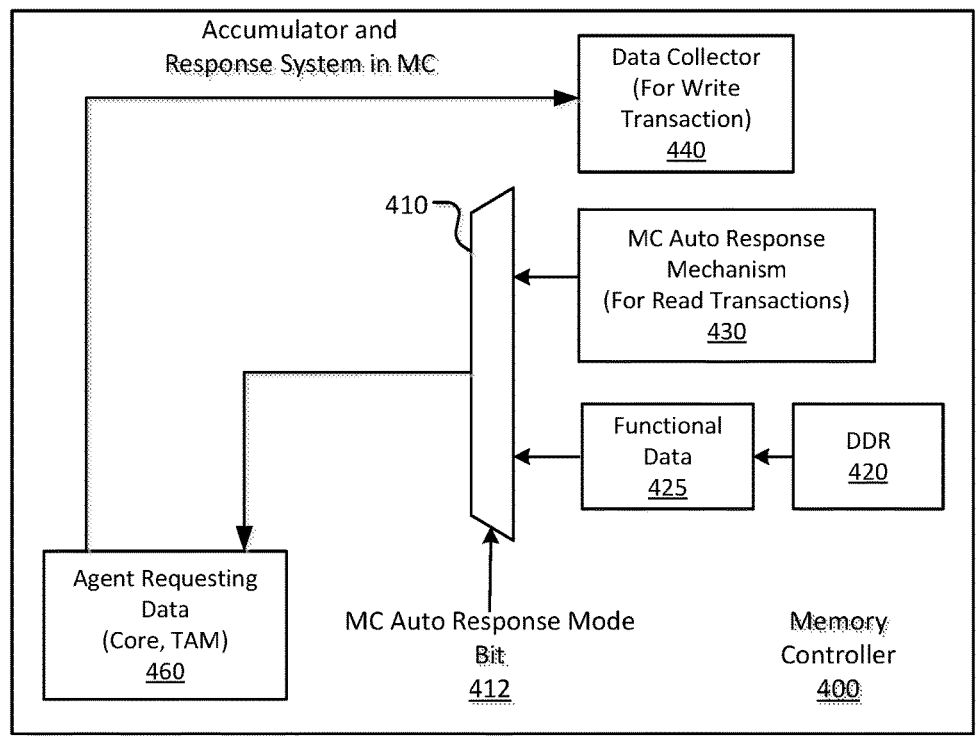
FIG. 4 is an illustration of a memory controller including an auto response mechanism according to an embodiment.

FIG. 4 is an illustration of a memory controller including an auto response mechanism according to an embodiment. In some embodiments, a memory controller 400 is to provide an accumulator and response mechanism for memory control testing. In some embodiments, a memory controller 400 is operable to provide auto response for the purpose of enabling back-to-back testing of the memory controller 400. As illustrated, an agent requesting data 460 may be a memory core in functional operation or a test access mechanism (TAM) for the testing of the memory controller 400.

In some embodiments, the memory controller 400 includes an auto response switching mechanism 410 for switching between a normal functional mode and an auto response mode, the auto response mode being a mode to support back-to-back testing of the memory controller. In a particular implementation for a read transaction, the memory controller 400 includes an auto response mode bit 412 to select between a normal functional mode, wherein functional data 425 from DDR memory 420 is provided to the requesting agent 460, and an auto response mode in which a memory controller auto response mechanism 430 is to provide data to the requesting agent 460. In this illustration, the auto response switching mechanism 410 is illustrated as a multiplexing mechanism (or multiplexer) that is controlled by the auto response mode bit 412. However, the switching mechanism is not limited to the illustrated implementation.

In some embodiments, the memory controller auto response mechanism 430 includes hardware to decode incoming transactions, and to respond with deterministic data for the no posted requests. In the testing mode the auto response mechanism 430 acts as the alternative to the regular functional path for DDR memory providing function data 425 in response to a read command. In some embodiments, the memory controller 400 further includes a data collector 440 for write transactions to accumulate data regarding the received transactions.

Figure 5:
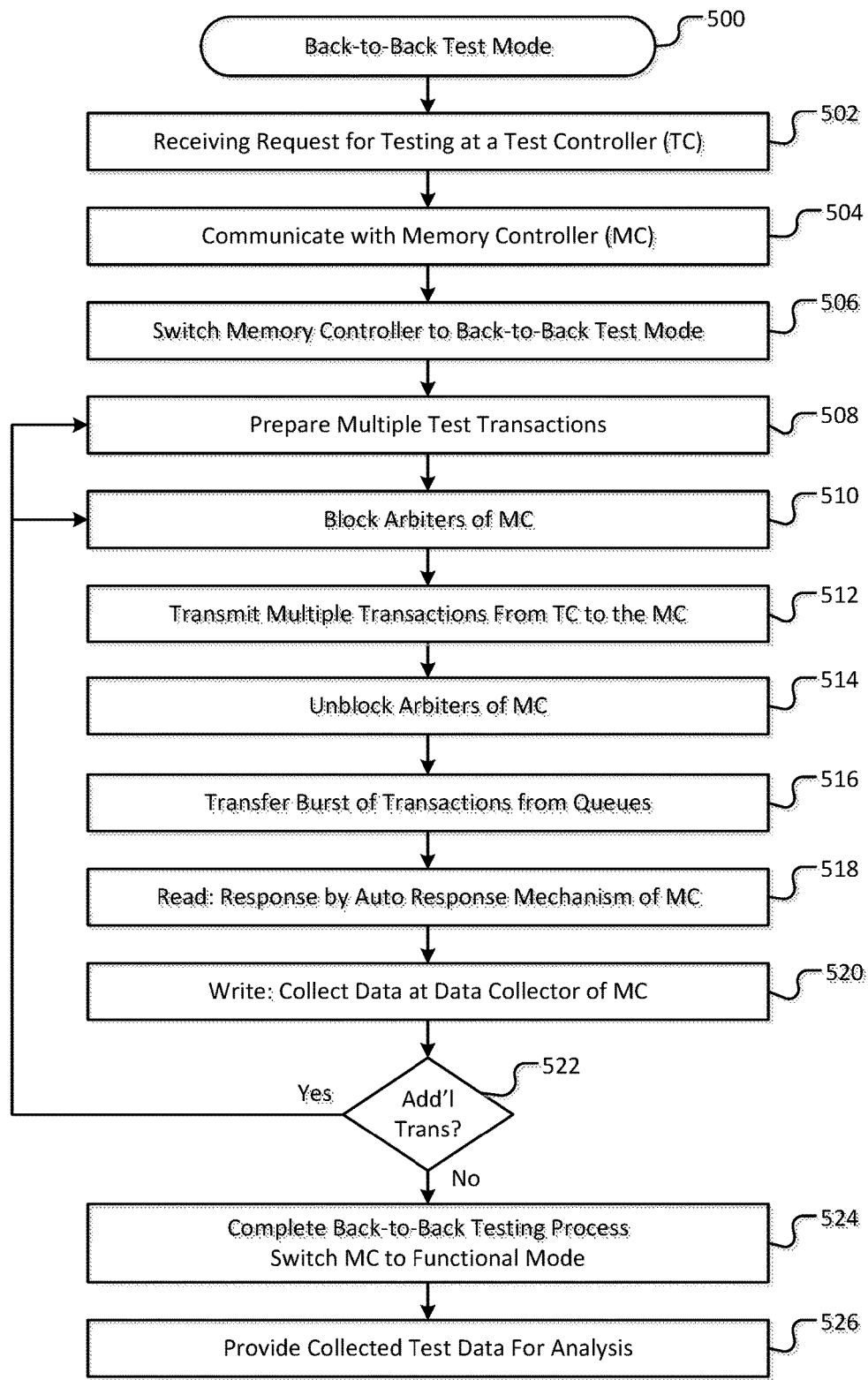
FIG. 5 is a flowchart to illustrate a process for back-to-back testing of a memory controller and other elements according to an embodiment.

FIG. 5 is a flowchart to illustrate a process for back-to-back testing of a memory controller and other elements according to an embodiment. In some embodiments, a process 500 may include the following:

502: Receiving a request for back-to-back memory control testing from a tester at a test controller.

504: Communicate with the memory controller via system fabric and IO units such as PCIE, SATA, and USB.

506: Switch the memory controller to a back-to-back test mode.

508: Prepare multiple test transactions for testing of memory controller and other elements of a system, which may include generating or obtaining test data. Commands may be posted, non-posted, and completion commands.

510: Block transaction arbiters of the memory controller.

512: Transmit multiple transactions to the memory controller to place in one or more arbiter queues.

514: Unblock the transaction arbiters upon a certain threshold number of memory transactions being placed in the one or more arbiter queues.

516: Transfer burst of transactions from the one or more arbiter queues.

518: For read transactions, provide response by auto response mechanism for receipt by the test controller.

520: For write transactions, collect data at data collector of the memory controller.

522: If there are additional transactions, the process may return to preparation of transactions 508, or, if the transactions have been prepared, to blocking of the transaction arbiters of the memory controller 510.

524: Otherwise, complete the back-to-back testing process and switch the memory controller from the back-to-back test mode to a functional mode.

526: In some embodiments, the process may continue with providing collected test data to the tester or other entity for analysis.

Figure 6:
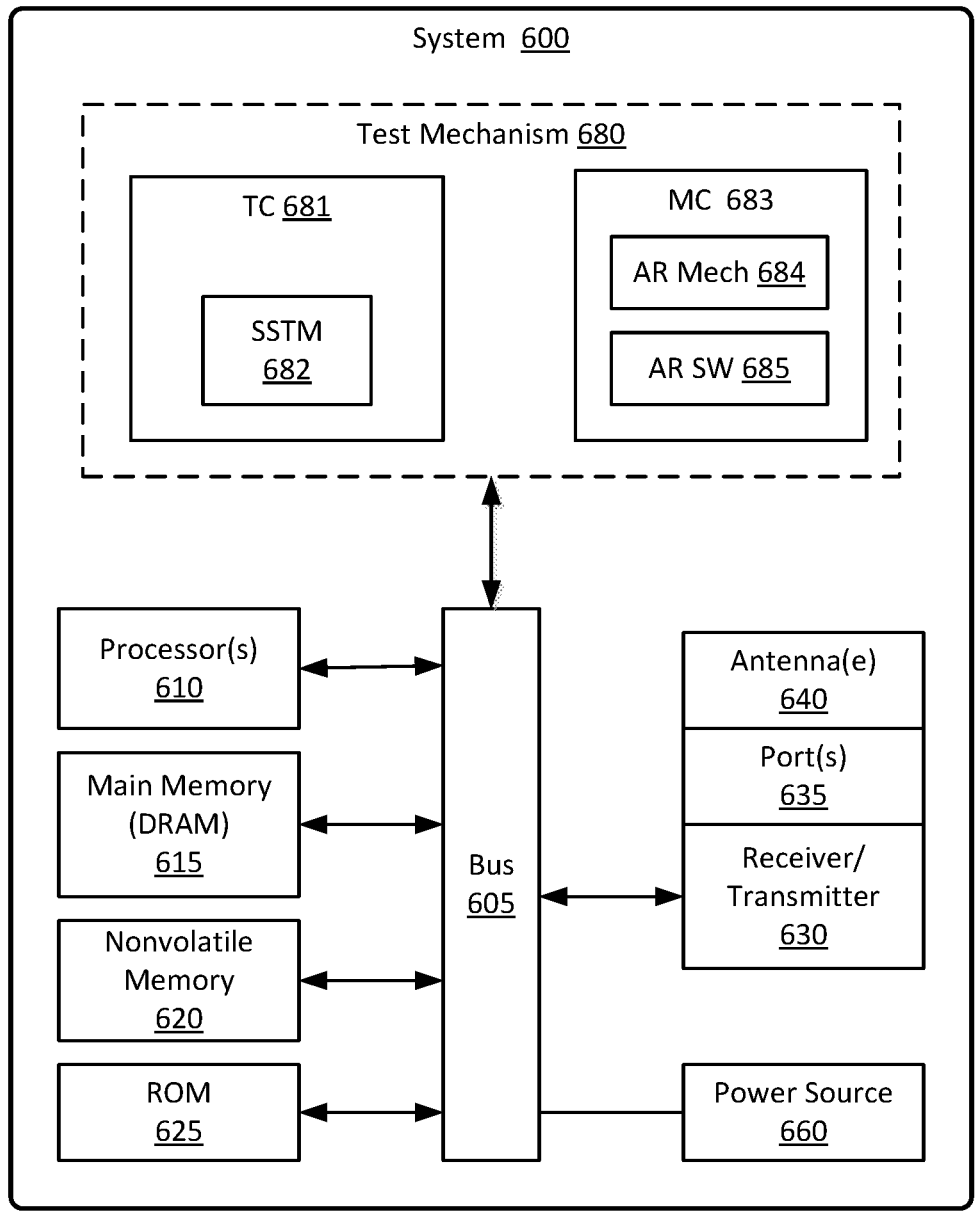
FIG. 6 is an illustration of a system including support for back-to-back testing of memory control components according to an embodiment.

FIG. 6 is an illustration of a system including support for back-to-back testing of memory control components according to an embodiment. In this illustration, certain standard and well-known components that are not germane to the present description are not shown. Elements shown as separate elements may be combined, including, for example, an SoC (System on Chip) combining multiple elements on a single chip.

In some embodiments, system 600 includes a test mechanism 680, the test mechanism including a test controller (TC) 681 including a specialized self-testing mechanism (SSTM) 682 to support back-to-back testing of a memory controller (MC) 683. In some embodiments, the memory controller includes an automatic response (AR) mechanism 684 to provide response to a test transaction, such as the auto response mechanism 430 illustrated in FIG. 4, and an auto response switching (AR SW) mechanism 685 to switch the memory control between a functional mode and a test mode, such as auto response switching mechanism 410 illustrated in FIG. 4.

In some embodiments, the system 600 further includes a processing means such as one or more processors 610 coupled to one or more buses or interconnects, shown in general as bus 605. The processors 610 may comprise one or more physical processors and one or more logical processors. In some embodiments, the processors may include one or more general-purpose processors or special-purpose processors.

The bus 605 is a communication means for transmission of data. The bus 605 is illustrated as a single bus for simplicity, but may represent multiple different interconnects or buses and the component connections to such interconnects or buses may vary. The bus 605 shown in FIG. 6 is an abstraction that represents any one or more separate physical buses, point-to-point connections, or both connected by appropriate bridges, adapters, or controllers.

In some embodiments, the system 600 further comprises a random access memory (RAM) or other dynamic storage device or element as a main memory 615 for storing information and instructions to be executed by the processors 610. Main memory 615 may include, but is not limited to, dynamic random access memory (DRAM).

The system 600 also may comprise a non-volatile memory 620; and a read only memory (ROM) 625 or other static storage device for storing static information and instructions for the processors 610.

In some embodiments, the system 600 includes one or more transmitters or receivers 630 coupled to the bus 605. In some embodiments, the system 600 may include one or more antennae 640, such as dipole or monopole antennae, for the transmission and reception of data via wireless communication using a wireless transmitter, receiver, or both, and one or more ports 635 for the transmission and reception of data via wired communications. Wireless communication includes, but is not limited to, Wi-Fi, Bluetooth™, near field communication, and other wireless communication standards.

The system 600 may also comprise a battery or other power source 660, which may include a solar cell, a fuel cell, a charged capacitor, near field inductive coupling, or other system or device for providing or generating power in the system 600. The power provided by the power source 660 may be distributed as required to elements of the system 600.

In some embodiments, an apparatus includes a test controller, the test controller including a specialized self-testing mechanism for memory control testing, the memory control testing including testing with back-to-back transactions; and a memory controller, the memory controller including one or more transaction arbiters, one or more arbiter queues for memory transactions, an auto response mechanism to provide a response to a read transaction, and a switching mechanism to switch the memory control between a functional mode and an auto response mode. In some embodiments, wherein the test controller is to generate a plurality of test transactions and transfer the plurality of test transactions to the memory controller, and the memory controller is to block the one or more transaction arbiters, place the plurality of test transactions in the one or more arbiter queues, and to unblock the transaction arbiters upon an event.

In some embodiments, unblocking the one or more transaction arbiters results in processing the plurality of test transactions as a burst of back-to-back transactions.

In some embodiments, the event is the placing of a certain threshold number of test transactions in the one or more arbiter queues.

In some embodiments, the memory controller further includes a data collector to collect data for write transactions.

In some embodiments, the auto response mechanism is to decode incoming transactions and to respond with deterministic data.

In some embodiments, the test controller further includes a pseudo random data generator to generate data for test transactions.

In some embodiments, the test controller transferring the plurality of test transactions includes the test controller transferring the plurality of test transactions to the memory controller via one or more IO (Input Output) units.

In some embodiments, the one or more IO units include one or more of a PCIE (Peripheral Component Interconnect Express) unit, an SATA (Serial AT Attachment) unit, or a USB (Universal Serial Bus) unit.

In some embodiments, a non-transitory computer-readable storage medium having stored thereon data representing sequences of instructions that, when executed by a processor, cause the processor to perform operations including receiving at a test controller a request for back-to-back memory control testing; switching a memory controller to a back-to-back test mode; preparing a plurality of test transactions; blocking one or more transaction arbiters of the memory controller; transmitting the plurality of test transactions to the memory controller to be placed in one or more arbiter queues of the memory controller; unblocking the one or more transaction arbiters upon the occurrence of an event; and transferring the plurality of test transactions from the one or more arbiter queues.

In some embodiments, unblocking the one or more transaction arbiters results in transferring the plurality of test transactions as a burst of back-to-back transactions.

In some embodiments, the event is the placing of a certain threshold number of test transactions in the one or more arbiter queues.

In some embodiments, the instructions further include instructions for collecting data for write transactions at a data collector.

In some embodiments, the instructions further include instructions for responding automatically to incoming test transactions. In some embodiments, responding automatically includes decoding incoming transactions and responding with deterministic data.

In some embodiments, preparing the plurality of test transactions includes generating pseudo random data for the plurality of test transactions.

In some embodiments, transmitting the plurality of test transactions to the memory controller includes transmitting the plurality of test transaction via one or more IO (Input Output) units. In some embodiments, the one or more IO units include one or more of a PCIE (Peripheral Component Interconnect Express) unit, an SATA (Serial AT Attachment) unit, or a USB (Universal Serial Bus) unit.

In some embodiments, an apparatus includes means for receiving at a test controller a request for back-to-back memory control testing; means for switching a memory controller to a back-to-back test mode; means for preparing a plurality of test transactions; means for blocking one or more transaction arbiters of the memory controller; means for transmitting the plurality of test transactions to the memory controller to be placed in one or more queues of the memory controller; means for unblocking the one or more transaction arbiters upon the occurrence of an event; and means for transferring the plurality of test transactions from the one or more arbiter queues.

In some embodiments, unblocking the one or more transaction arbiters results in transferring the plurality of test transactions as a burst of back-to-back transactions.

In some embodiments, the event is the placing of a certain threshold number of test transactions in the one or more arbiter queues.

In some embodiments, the apparatus further includes means for collecting data for write transactions at a data collector.

In some embodiments, the apparatus further includes means for responding automatically to incoming test transactions. In some embodiments, the means for responding automatically includes means for decoding incoming transactions and responding with deterministic data.

In some embodiments the means for, preparing the plurality of test transactions includes means for generating pseudo random data for the plurality of test transactions.

In some embodiments, the means for transmitting the plurality of test transactions to the memory controller includes means for transmitting the plurality of test transaction via one or more IO (Input Output) units. In some embodiments, the one or more IO units include one or more of a PCIE (Peripheral Component Interconnect Express) unit, an SATA (Serial AT Attachment) unit, or a USB (Universal Serial Bus) unit.

In some embodiments, a system includes a test controller, the test controller including a specialized self-testing mechanism for memory control testing, the memory control testing including testing with back-to-back transactions; and a memory controller, the memory controller including one or more transaction arbiters, one or more arbiter queues for memory transactions, an auto response mechanism to provide a response to a read transaction, and a switching mechanism to switch the memory control between a functional mode and an auto response mode; one or more IO (Input Output) units; and a system fabric, the test controller being coupled with the one or more IO units and the memory controller via the system fabric. In some embodiments, the test controller is to generate a plurality of test transactions and transfer the plurality of test transactions to the memory controller via the one or more IO units; and the memory controller is to block the one or more transaction arbiters, place the plurality of test transactions in the one or more arbiter queues, and to unblock the transaction arbiters upon an event.

In some embodiments, unblocking the one or more transaction arbiters results in processing the plurality of test transactions as a burst of back-to-back transactions.

In some embodiments, the memory controller further includes a data collector to collect data for write transactions.

In some embodiments, the test controller further includes a pseudo random data generator to generate data for test transactions.

In some embodiments, the one or more IO units include one or more of a PCIE (Peripheral Component Interconnect Express) unit, an SATA (Serial AT Attachment) unit, or a USB (Universal Serial Bus) unit.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. An apparatus comprising:
    a test controller, the test controller including a specialized self-testing mechanism for memory control testing, the memory control testing including testing with back-to-back transactions; and
    a memory controller, the memory controller including one or more transaction arbiters, one or more arbiter queues for memory transactions, an auto response mechanism to provide a response to a read transaction, and a switching mechanism to switch the memory control between a functional mode and an auto response mode;
    wherein the test controller is to generate a plurality of test transactions and transfer the plurality of test transactions to the memory controller; and
    wherein the memory controller is to block the one or more transaction arbiters, place the plurality of test transactions in the one or more arbiter queues, and unblock the transaction arbiters upon an event, wherein the event is the placing of a certain threshold number of test transactions in the one or more arbiter queues, and wherein the certain threshold number is greater than 1.

2. The apparatus of claim 1, wherein unblocking the one or more transaction arbiters is to result in processing the plurality of test transactions as a burst of back-to-back transactions.

3. The apparatus of claim 1, wherein the memory controller further includes a data collector to collect data for write transactions.

4. The apparatus of claim 1, wherein the auto response mechanism is to decode incoming transactions and to respond with deterministic data.

5. The apparatus of claim 1, wherein the test controller further includes a pseudo random data generator to generate data for test transactions.

6. The apparatus of claim 1, wherein transferring the plurality of test transactions includes transferring the plurality of test transactions to the memory controller via one or more IO (Input Output) units.

7. The apparatus of claim 6, wherein the one or more IO units include one or more of a PCIE (Peripheral Component Interconnect Express) unit, an SATA (Serial AT Attachment) unit, or a USB (Universal Serial Bus) unit.

8. A non-transitory computer-readable storage medium having stored thereon data representing sequences of instructions that, when executed by a processor, cause the processor to perform operations comprising:
receiving at a test controller a request for back-to-back memory control testing;
switching a memory controller to a back-to-back test mode; preparing a plurality of test transactions;
blocking one or more transaction arbiters of the memory controller;
transmitting the plurality of test transactions to the memory controller to be placed in one or more arbiter queues of the memory controller;
unblocking the one or more transaction arbiters upon the occurrence of an event, wherein the event is the placing of a certain threshold number of test transactions in the one or more arbiter queues, and wherein the certain threshold number is greater than 1; and
transferring the plurality of test transactions from the one or more arbiter queues.

9. The medium of claim 8, wherein unblocking the one or more transaction arbiters results in transferring the plurality of test transactions as a burst of back-to-back transactions.

10. The medium of claim 8, further comprising instructions that, when executed by the processor, cause the processor to perform operations comprising:
collecting data for write transactions at a data collector.

11. The medium of claim 8, further comprising instructions that, when executed by the processor, cause the processor to perform operations comprising:
responding automatically to incoming test transactions.

12. The medium of claim 11, wherein responding automatically includes decoding incoming transactions and responding with deterministic data.

13. The medium of claim 8, wherein preparing the plurality of test transactions includes generating pseudo random data for the plurality of test transactions.

14. The medium of claim 8, wherein transmitting the plurality of test transactions to the memory controller includes transmitting the plurality of test transaction via one or more IO (Input Output) units.

15. The medium of claim 14, wherein the one or more IO units include one or more of a PCIE (Peripheral Component Interconnect Express) unit, an SATA (Serial AT Attachment) unit, or a USB (Universal Serial Bus) unit.

16. A system comprising:
a test controller, the test controller including a specialized self-testing mechanism for memory control testing, the memory control testing including testing with back-to-back transactions; and
a memory controller, the memory controller including one or more transaction arbiters, one or more arbiter queues for memory transactions, an auto response mechanism to provide a response to a read transaction, and a switching mechanism to switch the memory control between a functional mode and an auto response mode;
one or more IO (Input Output) units; and
a system fabric, the test controller being coupled with the one or more IO units and the memory controller via the system fabric;
wherein the test controller is to generate a plurality of test transactions and transfer the plurality of test transactions to the memory controller via the one or more IO units; and
wherein the memory controller is to block the one or more transaction arbiters, place the plurality of test transactions in the one or more arbiter queues, and to unblock the transaction arbiters upon an event, wherein the event is the placing of a certain threshold number of test transactions in the one or more arbiter queues, and wherein the certain threshold number is greater than 1.

17. The system of claim 16, wherein unblocking the one or more transaction arbiters is to result in processing the plurality of test transactions as a burst of back-to-back transactions.

18. The system of claim 16, wherein the memory controller further includes a data collector to collect data for write transactions.

19. The system of claim 16, wherein the test controller further includes a pseudo random data generator to generate data for test transactions.

20. The system of claim 16, wherein the one or more IO units include one or more of a PCIE (Peripheral Component Interconnect Express) unit, an SATA (Serial AT Attachment) unit, or a USB (Universal Serial Bus) unit.

\* \* \* \* \*